United States Patent [19]

Otsuka

[11] Patent Number: 5,643,700
[45] Date of Patent: Jul. 1, 1997

[54] PHOTORESIST COMPOSITION AND METHOD OF EXPOSING PHOTORESIST

[75] Inventor: Yoichi Otsuka, Kanagawa, Japan

[73] Assignee: Sony Corporation, Tokyo, Japan

[21] Appl. No.: 966,442

[22] Filed: Oct. 26, 1992

[30]   Foreign Application Priority Data

Oct. 31, 1991 [JP] Japan .................. 3-313692

[51] Int. Cl.$^6$ .................. G03C 5/00; G03F 7/26
[52] U.S. Cl. .................. 430/30; 430/327; 430/395; 430/494; 430/944
[58] Field of Search .................. 430/494, 327, 430/395, 944, 30

[56]        References Cited

U.S. PATENT DOCUMENTS

| | | | |
|---|---|---|---|
| 4,822,718 | 4/1989 | Latham et al. | 430/512 |
| 4,997,745 | 3/1991 | Kawamura et al. | 430/281 |
| 5,147,758 | 9/1992 | Smothers et al. | 430/281 |

FOREIGN PATENT DOCUMENTS 3-82012   4/1991   Japan ........................... 430/30

OTHER PUBLICATIONS

Grant & Hackh's Chemical Dictionary, 5th Edition, Roger Grant & Claire Grant, eds. (1987) NY: McGraw-Hill pp. 166 & 434.
A. J. Gordon & R. Ford *The Chemist's Companion*; New York (1972) pp. 180–181.

Primary Examiner—Janis L. Dott
Attorney, Agent, or Firm—Hill, Steadman & Simpson

[57]          ABSTRACT

A satisfactory resist pattern can be formed, by focusing detection at a high accuracy, from a photoresist containing an infrared absorption dye and by an exposure method of determining focusing by an infrared light and using a photoresist containing the infrared absorption dye as the photoresist, whereby the focusing detection system is free from the effect of the secondary reflection or the like, that is, the focusing detection system is free from the effect of light transmitted or reflected in the substrate, whether the substrate is infrared light reflecting or permeating.

7 Claims, 2 Drawing Sheets

PHOTORESIST COMPOSITION AND METHOD OF EXPOSING PHOTORESIST

BACKGROUND OF THE INVENTION

1. Field of the Invention

The present invention concerns a photoresist composition and a method of exposing the photoresist. The Photoresist has been utilized, for example, for forming a pattern of an electronic part such as a semiconductor device. The present invention can be utilized generally in various application uses of the photoresist and, in particular, it can be utilized suitably in a case of using the photoresist when focusing upon exposure is determined by measurement using infrared rays.

2. Description of the Prior Art

In the case of exposing the photoresist, focusing has been detected by using infrared rays. FIG. 2(a) shows an example of measuring a distance when a photoresist 2 is formed on a semiconductor substrate 1a by coating followed by exposure using an infrared light 31 as an auto-focusing light. As shown in FIG. 2(a), the infrared light 31 is reflected on the surface of the photoresist 2, and the distance is measured by the surface reflection light 32, thereby automatically detecting the focusing position.

However, an exposure device of using the infrared light for an auto-focusing detection system has involved a problem that infrared light transmits by about 100% in the photoresist layer 2 making it impossible to correctly detect the auto-focusing at the surface of the photoresist layer 2.

As shown in FIG. 2(a), in the prior art, incident infrared light 31 for the detection of auto-focusing transmits the photoresist 2 to form a transmission light 38, which causes reflection on the surface of the substrate 1a to form a secondary reflection light 34. The secondary reflection light is further reflected at the surface of the photoresist 2 into the photoresist 2 and, further, reflected on the surface of the substrate 1a to sometimes form a tertiary reflection light 35. As a result, in the prior art, the reflected infrared rays are incident into the auto-focusing detection system in the form having a certain width, which results in deterioration of detection accuracy in the auto-focusing detection system.

In a case where the underlying substrate is made of a material capable of transmitting infrared light, the problem becomes more significant. FIG. 2(b) shows an example of measuring a distance when a photoresist 2 is formed on a quartz glass substrate 1b. As shown in FIG. 2(b), since a quartz glass substrate is used as the substrate in for example a TFT (thin film transistor) process, a light 36 transmitting the quartz glass substrate 1b is also reflected at the rear face of the substrate 1b into a reflection light 37 and it then enters the detection system. Accordingly, the detection accuracy for auto-focusing is further worsened.

Generally, in the optical auto-focusing described above, the upper surface of a member to be exposed is detected, which is driven so as to be aligned with an image surface of a projection lens. In the detection for the position of the upper surface, the position is measured by reflecting the infrared light emitting from a light emitting diode or the like on the upper surface of the exposed member and by detecting the position of the reflection light by a position sensor (PSD). In this case, if different reflection lights 32, 34, 35, 37 are present as described above and the detection light at an optical intensity distribution with a width enter the detection system, the output of PSD (position measuring value) indicates the gravitational center of the light intensity distribution. Accordingly, it suffers from the effect due to the mixing of the reflection light other than the surface reflection light 32. It is possible to use infrared light of three wavelength as the detection light (for example, infrared light at a wavelength of 880, 800 and 730 nm), thereby offsetting the deviation due to interference to some extent but it is eventually insufficient. Furthermore, the detection light in autofocusing as described above also suffers from remarkable effect by the thickness of the substrate (substrate made of semiconductor, quartz glass or the like), the nature of the layer on the substrate (layer thickness, refractive index, reflectance), etc. Although it is ideal that the focus value does not fractuate even if the thickness of each of the films should vary, the effect of the layer thickness or the like is large in the existent technique.

OBJECT OF THE INVENTION

An object of the present invention is to overcome the foregoing problems in the prior art and provide a photoresist composition and a method of exposing a photoresist in which a focus detection system is free from the effect, for example, of the secondary reflection, that is, the focus detection system is free from the effect of light transmitted or reflected in the substrate or the like, as well as, the focusing detection system is free from the effect, also due to various factors of an member to be exposed, for example, the reflectance of the substrate, as well as the substrate structure such as thickness and steps of substrate, photoresist and various kinds of other layers formed upon exposure if necessary or required, and, accordingly, capable of forming a satisfactory resist pattern by the focus detection at a high accuracy.

SUMMARY OR THE INVENTION

The foregoing object of the present invention can be attained by a photoresist composition for use in a forming a resist pattern by exposure and development, wherein the composition comprises infrared absorbing dye. Another object of the present invention can be attained by a method of exposing a photoresist for determining focusing by infrared rays upon exposure of the photoresist, wherein a photoresist containing an infrared absorption dye is used as the photoresist.

The method of exposing the photoresist according to the present invention provides a particularly remarkable effect in a case where the photoresist is formed on a substrate transparent to infrared rays which involves a problem in the detection accuracy of autofocusing.

In the present invention, dyes shoving absorption in near infrared-infrared regions (700–1000 nm) can be used as the infrared absorbing dye. For instance, there can be mentioned, for example, cyanine dye, squarilium dye, methine dye, naphthoquinone dye, quinone imine dye, quinone diimine dye, phthalocyanine, tetrahydrocholine, ethylene-1,2-dithiol metal (in particular, Ni) complex.

As actual pigment (dye), there can be mentioned, for example, CY-9 and IR 820.

The infrared absorption dye may be added in the photoresist so as to absorb infrared rays to such an extent as capable of suppressing secondary reflection. Generally, a preferred addition amount is about 1 to 3 wt % relative to the photoresist solid content.

Infrared absorption dyes that can be used preferably in the present invention are exemplified below. Name of substance, chemical formulae and maximum absorption wave length in infrared region (in parenthesis unit: Nm).

(1) Quinone series dye
1-1: 8-phenylamino-5-amino-2,3-dicyano-1,4-naphthoquinone

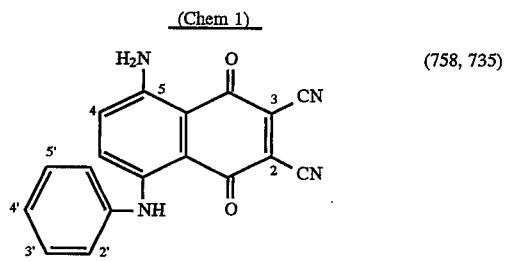

(Chem 1)                                      (758, 735)

1-2: 8-(4'-methylphenylamino)-5-amino-2,2,3-cyano-1,4-naphthoquinone
(4'-Me) $C_{19}H_{12}N_4)_2$ (760)

1-3: 8-(4'-methoxyphenyl)-5-amino-2,3-dicyano-1,4-naphthoquinone
(4'-OMe) $C_{19}H_{12}N_4O_2$ (760)

1-4: 8-(4'-chlorophenylamino)-5-amino-2,3-dicyano-amino-1,4-naphthoquinone
(4'-Cl) $C_{18}H_9H_4O_2Cl$ (348.5) (758)

1-5: 8-(4'-dimethylaminophenylamino)-5-amino-2,3-dicyano-1,4-naphthoquinone
(4'-NM$_2$) $C_{20}H_{15}N_5)_2$ (802)

1-6:
(5,10-(NHPh)$_2$)$C_{28}H_{18}N_2O_2$ (703)

1-7: 2-anilino-3,4-phthaloylacridone
(2-NHPh) $C_{27}H_{18}N_2O_3$ (721)

1-8: 2-(4-toluidino)-3,4-phthaloylacridone
(2-NHC$_6$H$_4$Me-(m)) $C_{28}H_{18}O_3$ (718)

1-9: 2-(4-anisidino)-3,4-phthaloylacridone
(2-NHC$_6$H$_4$Me-(p)) $C_{28}H_{28}N_2O_4$ (732)

1-10: 2-(3-chloroanilino)-3,4-phthaloylacridone
(2-NHC$_6$H$_4$Cl-(m)) $C_{27}H_{15}N_2O_3Cl$ (707)

1-11: 2-(4-chloroanilino)-3,4-phthaloylacridone
(2-NHC$_6$H$_4$Cl-(p)) $C_{27}H_{15}N_2O_3Cl$ (718)

1-12: 2-(3-nitroanilino)-3,4-phthaloylacridone
(2-NHC$_6$H$_4$NO$_2$(m)) $C_{27}H_{15}N_3O_5$ (695)

1-13: 6,15-bis(4-anisidino)indanthrene
(6,15-(NHC$_6$H$_4$OMe-(P))$_2$ $C_{42}H_{28}N_4O_6$ (715–720,790)

1-14: 6,15-bis(4-ethoxyanilino)indanthrene
(6,15-(NHC$_6$H$_4$Et-(p))$_2$ $C_{42}H_{32}N_4O_6$ (720,790)

(2) Polymethine series dye
2-1: Bis(dimethylanino)streptopolymethinecyanine
($C_{17}H_{25}Cl$) (848)

2-2: 3,3'-dimethyl-2,2'-thiatricarbocyanine iodide
$C_{23}H_{21}N_2IS_2$ (752)

2-3: 3,3'-diethyl-2,2'-thiatricarbocyanine perchlorate
$C_{23}H_{25}N_2O_4ClS_2$ (773, 870)

2-4: 3,3'-di(3-acetoxypropyl)-11-diphenylamino-10,10-ethylene-5,6,5',6'-dibenzothiatricarbocyanine perchlorate
$C_{53}H_{48}N_3O_8ClS_2$ (831,972)

(3) Diphenylmethane series dye
3-1: Phenylphenylvinylmethylum chloride
$C_{23}H_{21}Cl$ (714)

3-2: (4-methoxyphenyl)-(4'-methoxyphenylvinyl)methylum chloride
$C_{19}H_{21}O_2Cl$ (725)

3-3: (4-dimethylaminophenyl)-(4'-dimethylaminophenylvinyl) methylum chloride
$C_{21}H_{25}N_2Cl$ (790)

(4) Polyphine series dye
4-1: Phthalocyanine
$C_{32}N_{18}N_8$ (700,772)

4-2: Triphenylphthalocyanine Sn complex (720)

4-3: Triphenylphthalocyanine Pb complex (725)

Description will now be made to the function of the present invention with reference to schematic drawings of FIG. 1 (a)-(c).

In the present invention, an infrared absorption dye is incorporated in the photoresist 2. As a result, when an infrared light 31, in particular, infrared light for auto-focussing enters as shown in FIG. 1(a), if there is any light incident into the photoresist 2 in addition to the reflection light 32 as shown in FIG. 1(a), it is absorbed as shown by a reference numeral in the figure. As a result, in the infrared light 31, only the surface reflection light 32 is emitted externally. Accordingly, satisfactory auto-focusing detection is enabled only by the surface reflection light 32. In the function of the present invention, a similar effect can also be provided in a case where the underlying substrate is a semiconductor substrate 1a or a quartz substrate 1b.

Assuming that the underlying substrate is, for example, a semiconductor substrate 1a, not all of the incident infrared light 33 in the photoresist 2 is not absorbed but reflected on the substrate 1a as shown in FIG. 1(b), the reflection light is absorbed as indicated by a reference numeral 4 during transmission of the reflection light after reflection in the photoresist 2. Accordingly, the same effect as described above can be attained.

Further, it is assumed that the underlying substrate is a quartz substrate 1b, and infrared rays transmitting the photoresist 2 further transmits as shown by a reference numeral 36 through the quartz substrate 1b and is then reflected at the rear face. Also in this case, the reflection light is absorbed as shown by a reference numeral 42 till it emits finally through the resist 2. Reference numeral 41 denotes an infrared light reflected at the surface of the quartz substrate 1b and absorbed in the resist 2.

EXAMPLE

Description will now be made to examples of the present invention. However, the present invention is no way limited to the examples shown below.

Example 1

In this example, an infrared absorbing dye having an absorption near $\lambda=700$ nm is added to a usual positive type photoresist, that is, a photoresist having no substantial absorption at a wavelength of greater than about 500 nm. A dye having absorption near 700 nm can optionally be used from various kinds of infrared absorption dyes described above. As noted above, a variety of dyes having absorption in the near infrared regions (700–1000 nm) can be utilized as the infrared absorbing dye of the present invention. The selection of a suitable infrared absorption dye is optional and depends upon the infrared light utilized as the auto-focusing detection light.

As an actual setting, the infrared absorption dye may be selected depending on the wavelength of infrared rays for auto-focussing. That is, a usual exposure device, for example, a diminishing projection exposure device for a semiconductor wafer (wafer stepper) uses near infrared-rays having no sensitivity to the photoresist for the auto-focussing detection system. Accordingly, the wavelength providing absorption to a dye to be incorporated can be selected in accordance with the wavelength of infrared rays for the detection of auto-focussing and can be added.

Figure 1A:
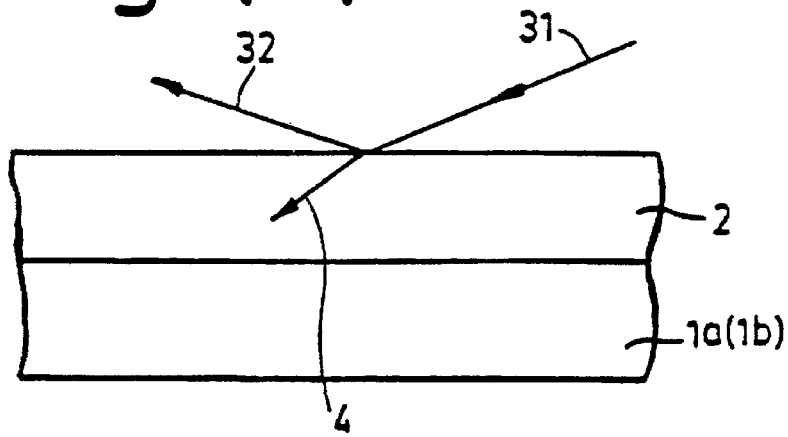
FIG. 1 is an explanatory view of the operation of the present invention.
Figure 1B:
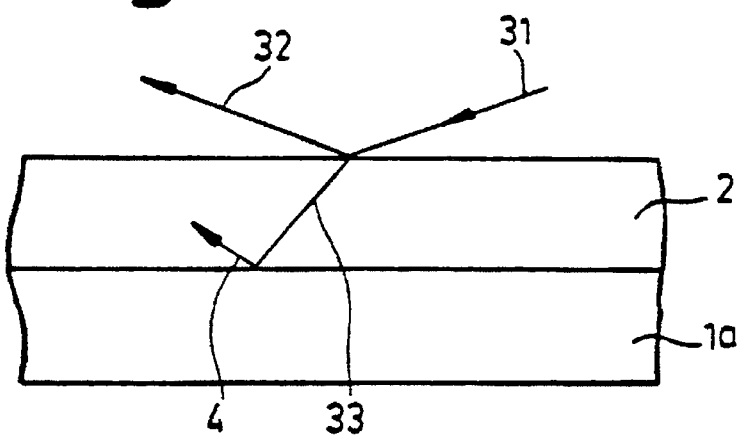
Figure 1C:
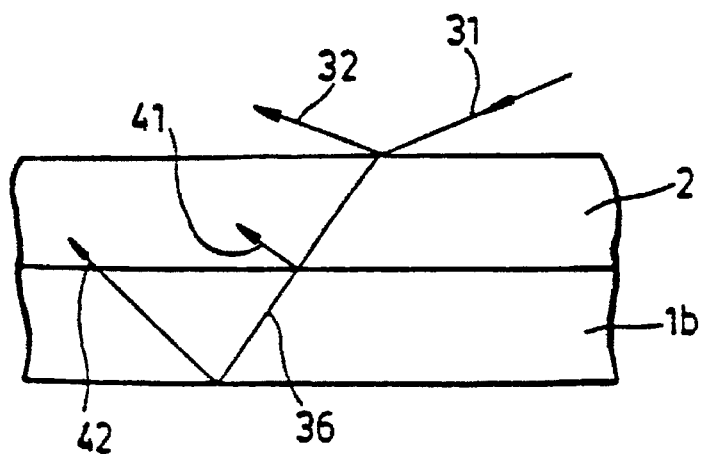
Figure 2A:
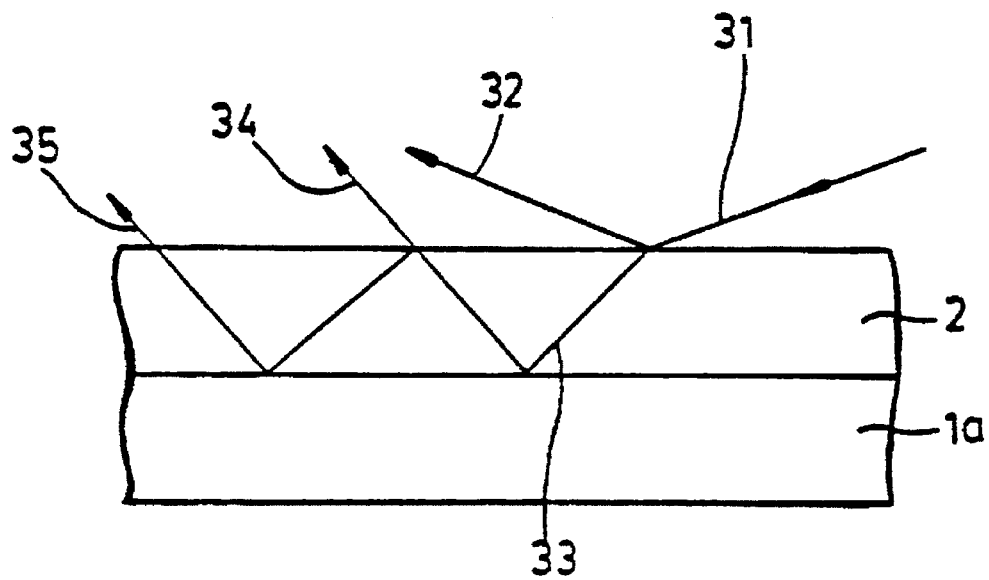
FIG. 2 is a view illustrating prior art.
Figure 2B:
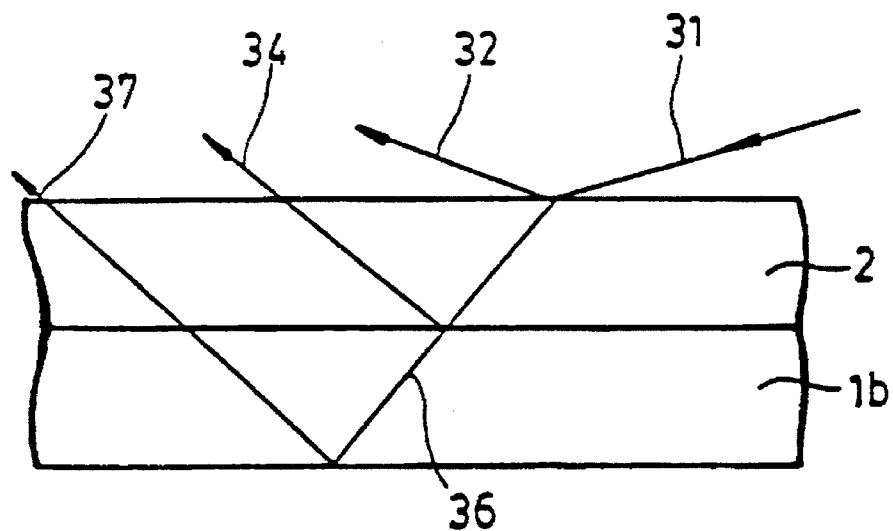

Further, since infrared light for auto-focussing detection usually enters to a substrate from an oblique direction, the dye may be added by so much as absorbing the incident light till it reaches the substrate (1a),(1b) as shown in FIG. 1(a) or by so much as absorbing the secondary reflection light and the rear face reflection light in the layer of the resist 2 as shown in FIG. 1(b), (c). Further, the addition amount can be controlled also by the thickness of the photoresist 2.

In this example, the resist was exposed using an infrared light at 700 nm as the auto-focusing detection light and a resist pattern of good shape could be obtained by satisfactory exposure owing to an adequate determination for the focusing position.

Example 2

In this example, an infrared absorption dye having absorption near λ=800 nm was added. Also in this example, the same excellent effect as that in Example 1 could be obtained by using an infrared light at 800 nm as the auto-focusing detection light.

Example 3

In this example, an infrared absorption dye having absorption near λ=900 nm was added. Also in this example, the same excellent effect as that in Example 1 could be obtained by using an infrared light at 900 nm as the autofocusing detection light.

Example 4

In this example, an infrared absorption dye having absorption near λ=700-900 nm was added. Also in this example, the same excellent effect as that in Example 1 could be obtained by using an infrared light at 700-900 nm as the autofocusing detection light.

In each of the examples, the band width of the absorption wavelength and the absorption ratio are optional. Again, a variety of infrared absorbing dyes may be used pursuant to the present invention. The wavelength and corresponding absorbance of such dyes are selected at one's option.

As has been described above, according to the photoresist composition and the method of exposing the photoresist of the present invention, the focus detection system is free from the effect of secondary reflection or the like, that is, the focus detection system is free from the effect of a light that penetrates through or reflected in the substrate or the like, as well as the focus detection system is kept from undergoing the effect of various factors of material to be exposed, for example, reflectance of the substrate, thickness of the substrate, photoresist and other various kinds of layers formed, as necessary, upon exposure in a case of forming a resist pattern by using the photoresist, so that a satisfactory resist pattern can be formed by focusing detection at a high accuracy.

What is claimed is:

1. A method of exposing a photoresist composition which is a lithographic step of forming a resist pattern comprising the steps of:

applying a photoresist composition to form a single photoresist layer on a substrate to be patterned, the photoresist composition having incorporated therein an infrared absorption dye;

projecting an incident infrared light onto the single photoresist layer; and detecting a focusing position by measuring a reflection light of the incident infrared light, wherein the infrared absorption dye has an adsorption at a wavelength of the infrared light used for detecting the focusing position.

2. A method of exposing the photoresist composition as defined in claim 1, wherein the infrared absorption dye is selected from the group consisting of: cyanine dye, squarilium dye, naphthoquinone dye, quinone imine dye, quinone diimine dye, phthalocyanine, tetradehydrocholine, and ethylene-1,2-dithiol metal complex.

3. The method of claim 1 wherein the incident infrared light can transmit through the substrate.

4. A method of exposing the photoresist composition as defined in claim 3, wherein the infrared absorption dye is selected from the group consisting of: cyanine dye, squarilium dye, naphthoquinone dye, quinone imine dye, quinone diimine dye, phthalocyanine, tetradehydrocholine, and ethylene-1,2-dithiol metal complex.

5. The method of claim 1 wherein the incident infrared light has a wavelength of 700–900 nm and the infrared absorption dye has an absorption at a wavelength of 700–900 nm.

6. A method of exposing a photoresist composition which is a lithographic step of forming a resist pattern comprising the steps of:

projecting an incident infrared light onto a photoresist composition coated on a substrate, and detecting a focusing position by measuring a reflection light of the incident infrared light, wherein the photoresist composition includes an infrared absorption dye in an amount of about 1 to 3 weight percent relative to the solid content of the photoresist, the infrared absorption dye having an absorption at a wavelength of the infrared light used for detecting the focusing position.

7. A method of exposing a photoresist composition which is a lithographic step for forming a resist pattern comprising the steps of:

projecting an incident infrared light onto a photoresist composition coated on a substrate, and detecting the focusing position by measuring a reflection light of the incident infrared light, wherein the incident infrared light can transmit through the substrate and the photoresist composition includes an infrared absorption dye in an amount of about 1 to 3 weight percent relative to the solid content of the photoresist, the infrared absorption dye having an absorption at a wavelength of the infrared light used for detecting the focusing position.

* * * * *